United States Patent
Mitchell et al.

(10) Patent No.: US 8,716,083 B2
(45) Date of Patent: May 6, 2014

(54) UNITARY FLOATING-GATE ELECTRODE WITH BOTH N-TYPE AND P-TYPE GATES

(75) Inventors: Allan T. Mitchell, Heath, TX (US); Imran Mahmood Khan, Richardson, TX (US); Michael A. Wu, Audubon, PA (US)

(73) Assignee: Texas Instruments Incorporated, Dallas, TX (US)

( * ) Notice: Subject to any disclaimer, the term of this patent is extended or adjusted under 35 U.S.C. 154(b) by 357 days.

(21) Appl. No.: 13/359,253

(22) Filed: Jan. 26, 2012

(65) Prior Publication Data
US 2012/0244671 A1 Sep. 27, 2012

Related U.S. Application Data

(62) Division of application No. 13/070,263, filed on Mar. 23, 2011, now Pat. No. 8,178,915.

(51) Int. Cl.
*H01L 21/336* (2006.01)
(52) U.S. Cl.
USPC .......................................... 438/239; 438/396
(58) Field of Classification Search
USPC ................................. 438/239, 396
See application file for complete search history.

(56) References Cited

PUBLICATIONS

Ahuja et al., "A Very High Precision 500-nA CMOS Floating-Gate Analog Voltage Reference," J. Solid-State Circ., vol. 40, No. 12 (IEEE, Dec. 2005), pp. 2364-2372.
Lande et al., "An Analog Floating-Gate Memory in a Standard Digital Technology," Proceedings of the Fifth International Conf. on Microelectronics for Neural Networks (IEEE, 1996), pp. 271-276.
U.S. Appl. No. 13/070,222, filed Mar. 23, 2011, entitled "Low Leakage Capacitor for Analog Floating-Gate Integrated Circuits," commonly assigned.

*Primary Examiner* — Long Pham
(74) *Attorney, Agent, or Firm* — Rose Alyssa Keagy; Wade J. Brady, III; Frederick J. Telecky, Jr.

(57) ABSTRACT

An analog floating-gate electrode in an integrated circuit, and method of fabricating the same, in which trapped charge can be stored for long durations. The analog floating-gate electrode is formed in a polycrystalline silicon gate level, and includes n-type and p-type doped portions serving as gate electrodes of n-channel and p-channel MOS transistors, respectively; a plate of a metal-to-poly storage capacitor; and a plate of poly-to-active tunneling capacitors. Silicide-block silicon dioxide blocks the formation of silicide cladding on the electrode, while other polysilicon structures in the integrated circuit are silicide-clad. An opening at the surface of the analog floating-gate electrode, at the location at which n-type and p-type doped portions of the floating gate electrode abut, allow formation of silicide at that location, shorting the p-n junction.

7 Claims, 7 Drawing Sheets

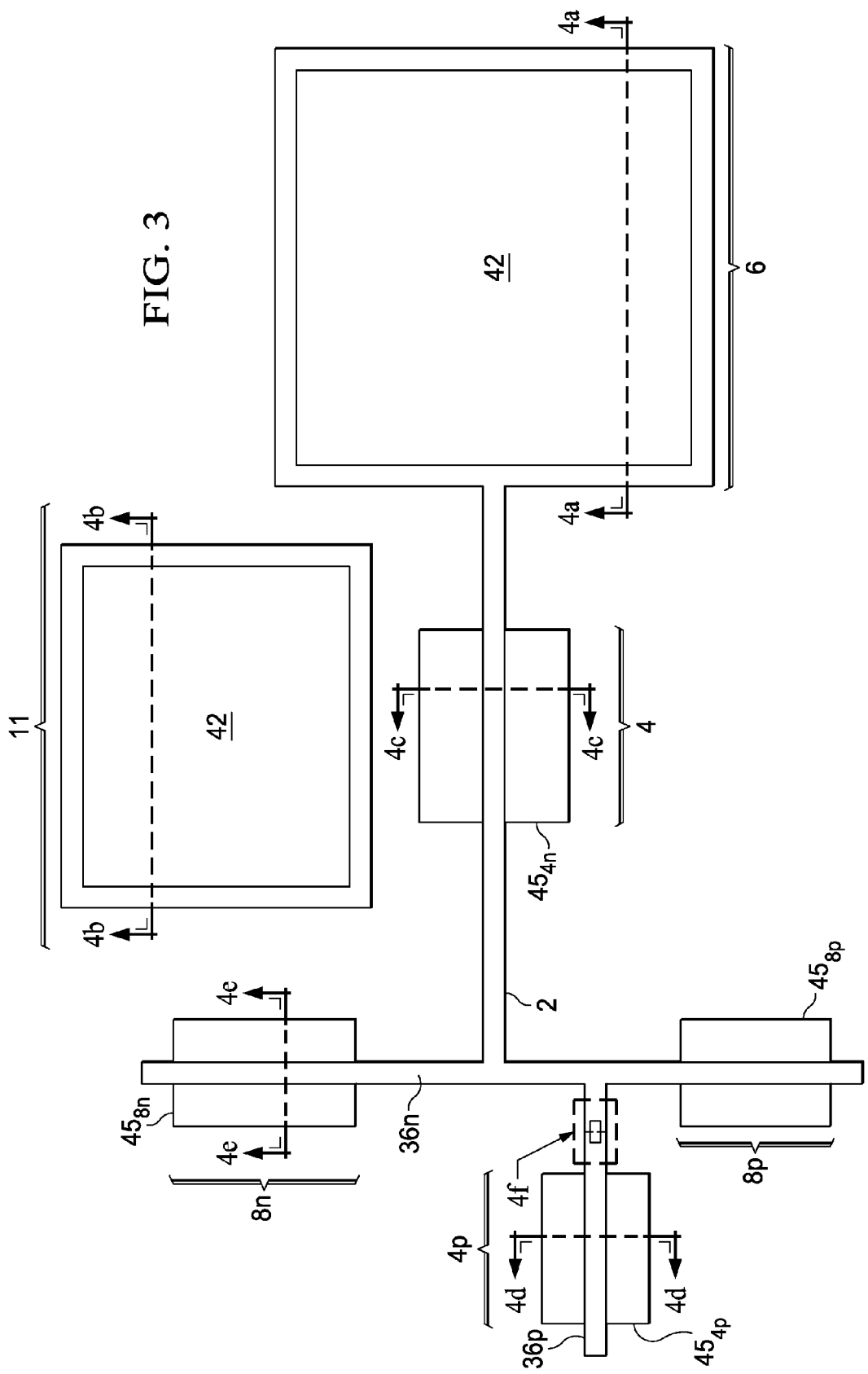

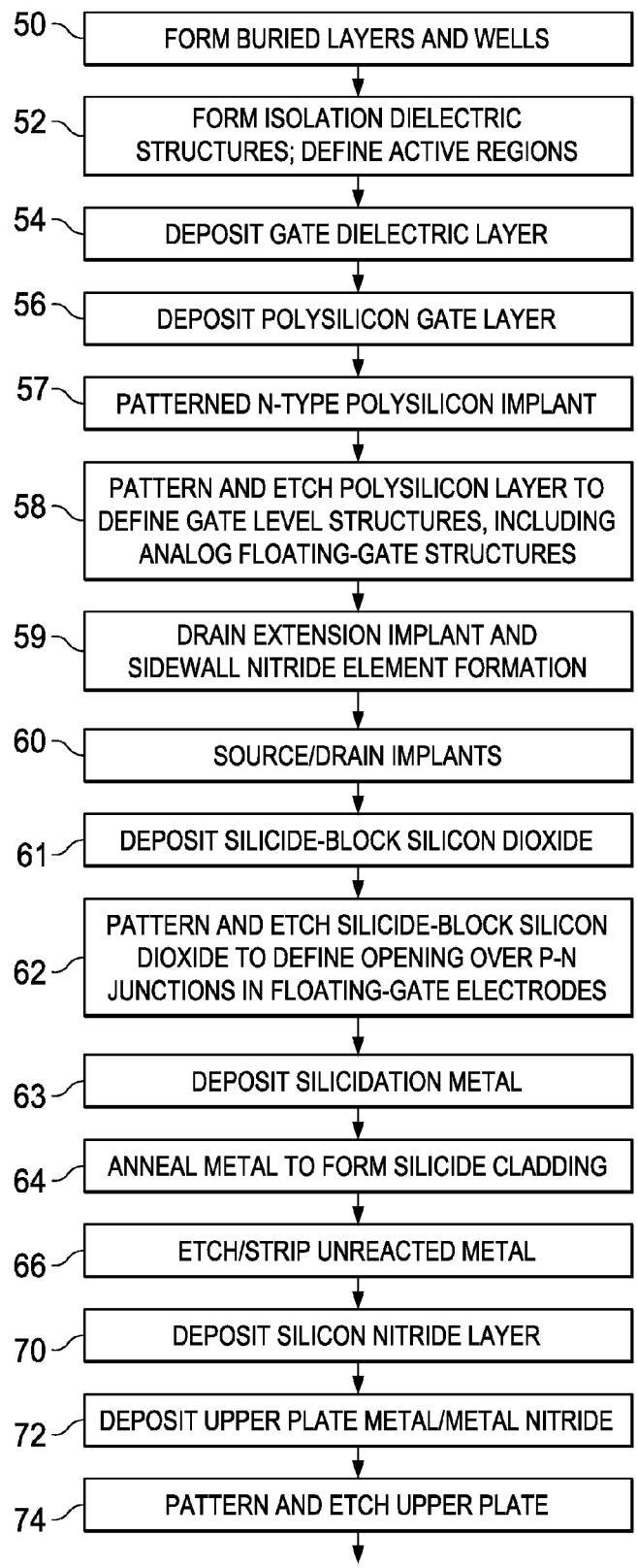

UNITARY FLOATING-GATE ELECTRODE WITH BOTH N-TYPE AND P-TYPE GATES

CROSS REFERENCE TO RELATED APPLICATIONS

This application is a divisional of Application No. 13/070,263, field Mar. 23, 2011, which is incorporated herein by reference.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are more specifically directed to structures storing an analog level for application to transistor gates.

An important type of semiconductor integrated circuits are those circuits that implement analog circuit functions in which input and output signals and information are communicated and processed as such. Analog circuit functionality is important in such diverse fields as instrumentation and control systems, audio applications, power management of large-scale electronic systems, communications functions, motor control functions (e.g., such as in hard disk drives), and the like. Some integrated circuits, for example interface circuitry such as analog-to-digital converters (ADCs) and digital-to-analog converters (DACs), include both analog and digital functionality.

Typically, analog integrated circuit functions rely on reference levels (voltages and currents) that are established and regulated on-chip. These reference levels are often involved in such functions as signal measurement, signal conditioning, conversion and interface functions (ADCs and DACs), etc. Proper functioning of the analog integrated circuit, and particularly such functioning over variations in power supply voltage, temperature, and other operating conditions, often critically depends on the stability of reference voltages and currents over such variations. In addition, manufacturing variations as reflected in physical parameters of the integrated circuits, can affect the reference levels as generated in these integrated circuits.

Accordingly, many analog integrated circuits include some ability to "trim" or adjust the on-chip precision reference circuits, as well as other circuit functions within those integrated circuits. Trimming is typically performed at manufacture, after electrical measurement or other evaluation of the performance of the raw circuit as manufactured. Various technologies for such trimming and adjustment are known, including laser trimming of resistors, and programming of fuses or antifuses in a digital control word that selectively shunts resistors within a resistor bank. Recently, programmable non-volatile memory elements have been considered for use as trimming elements, for example in replacement of fuses or antifuses. Examples of these non-volatile memory elements include floating-gate metal-oxide-semiconductor (MOS) transistors, in which the state of the transistor is defined by charge trapped at a floating gate electrode. Programming of the device is accomplished through such mechanisms as Fowler-Nordheim tunneling, and hot carrier injection.

Certain analog applications, such as high-precision ADCs and DACs, require extremely precise and stable reference circuits. Not only must the reference levels have a high initial accuracy (e.g., on the order of 1 mV for a reference voltage on the order of 5 volts), but temperature stability of on the order of 5 ppm/° C. and long-term drift of on the order of 10 ppm/1000 hours are also now commonly required. To achieve such precision, it is useful to more directly trim circuit elements, such as circuit elements at the inputs and in the feedback loops of amplifiers in the reference circuits. In addition, such direct trimming of circuit elements can result in reduced power consumption than resistor-bank type of trimming circuits, which is of course well-suited for modern battery-powered applications.

It is attractive to use floating-gate techniques to trim capacitors directly at the reference circuit amplifier, because of the precision with which charge may be programmed according to modern programming methods, and also because the programming operation can be carried out by purely electrical means. But any trapped charge applied in such trimming must be retained at the floating gate for the life of the device, considering that the trimming may only be performed at the time of manufacture. Conventional capacitor dielectric films in analog integrated circuits have been observed, in connection with this invention, to exhibit some degree of leakage over time. An example of such a conventional capacitor dielectric is silicon nitride deposited by plasma-enhanced chemical vapor deposition (PECVD). As such, the use of floating-gate capacitor technology in conventional analog circuits would require additional costly processes such as deposition of dielectric films specifically for the programmable capacitors, deposition and patterning of an additional conductor layer, and the like.

Ahuja et al., "A Very High Precision 500-nA CMOS Floating-Gate Analog Voltage Reference", *J. Solid-State Circ., Vol.* 40, No. 12 (IEEE, December 2005), pp. 2364-72 describes the use of floating-gate technology in precision analog reference circuits. In this article, the floating-gate device is constructed as a double-level polysilicon device. Tunneling regions between the two polysilicon levels is formed as a 400 Å film of silicon dioxide. It is believed that the manufacturing process implemented into this structure is relatively costly, given the requirement that a separate tunneling oxide film be deposited. In addition, this approach uses a relatively thick tunneling oxide film, which results in a relatively small capacitance per unit area.

As described above, analog floating-gate electrodes effectively provide the function of a non-volatile analog memory, storing an analog level in the form of the level of charge trapped at the floating-gate electrode. Sensing of the stored state at an analog-floating gate electrode is typically performed by a portion of the analog floating-gate electrode serving as the gate electrode of a MOS transistor. In this way, the conduction of the MOS transistor under source/drain bias reflects the potential at its gate electrode, and thus correlates to the level of charge trapped at the analog floating-gate electrode.

It is desirable, in some applications, to realize analog floating-gate memory functions in a complementary-MOS (CMOS) fashion, with the analog floating-gate electrode serving as the gate electrode for both an n-channel MOS transistor and also a p-channel MOS transistor. Such an arrangement allows sensing of the charged state by the voltage at the common drain node of a CMOS transistor pair, facilitating the sensing and communication of the stored level.

BRIEF SUMMARY OF THE INVENTION

Embodiments of this invention to provide a programmable analog floating-gate element, and method of fabricating the same, including both p-type and n-type regions suitable as gate electrodes in a CMOS environment, and that provides repeatable programmability and long-term charge retention.

Embodiments of this invention provide such an element and method that can be efficiently implemented in an existing CMOS manufacturing process flow.

Embodiments of this invention provide such an element and method in which the programmed capacitor has a high capacitance per unit area, and thus can be implemented efficiently in minimal chip area.

Embodiments of this invention provide such an element and method in which inclusion of the floating-gate element does not necessitate change in the construction or electrical parameters of other circuit elements.

Embodiments of this invention provide such an element and method that is compatible with high voltage circuit applications.

Other objects and advantages of embodiments of this invention will be apparent to those of ordinary skill in the art having reference to the following specification together with its drawings.

Embodiments of this invention may be implemented into an integrated circuit, at the polysilicon gate level. The integrated circuit may include polysilicon gate electrodes, and perhaps capacitor plates, that are clad with a metal silicide such as cobalt silicide. In such an integrated circuit, a floating gate electrode in that same polysilicon gate level is protected from direct react silicidation by a silicide-block silicon dioxide film. N-type and p-type doped portions of the floating gate electrode overlie respective active regions, to serve as the gate electrode for n-channel and p-channel transistors, respectively. Another portion of that floating gate electrode serves as a plate of a storage capacitor, the other plate of which is formed of a metal or metal nitride plate, with the silicon block silicon dioxide and another dielectric film therebetween. At least one other portion of the floating gate electrode overlies active regions with the gate dielectric therebetween, to define one or more tunnel capacitors. An opening in the silicide-block silicon dioxide film, overlying a junction between n-type and p-type portions of the analog floating-gate electrode, is etched prior to deposition of the silicidation metal. As a result, a silicide strap shorts out the p-n junction within the electrode, eliminating inconsistency in programming of the desired charge level.

BRIEF DESCRIPTION OF THE SEVERAL VIEWS OF THE DRAWING

FIG. 3 is a plan view of the physical construction of the analog floating-gate device of FIG. 2, according to an embodiment of the invention.

FIG. 5 is a flow diagram illustrating an example of the manufacturing process for fabricating the device of FIGS. 3 and 4a through 4g, according to an embodiment of the invention.

DETAILED DESCRIPTION OF THE INVENTION

The present invention will be described in connection with one or more of its embodiments, namely as implemented into an analog floating-gate memory element, because it is contemplated that this invention will be especially beneficial when used in such an application. However, it is also contemplated that this invention can provide important benefits in other circuit and structure applications. Accordingly, it is to be understood that the following description is provided by way of example only, and is not intended to limit the true scope of this invention as claimed.

Many complementary metal-oxide-semiconductor (CMOS) circuits, including those involved in analog floating-gate memory elements, as will be described below, are based on the series connection of the source/drain path of a p-channel MOS transistor in series with that of an n-channel MOS transistor, in which the gates of the two transistors are connected in common at the same input node. In the context of an analog floating-gate memory element, a single polycrystalline silicon (i.e., polysilicon) unitary floating-gate electrode, on which charge is trapped to set the state of the element, preferably serves as the gate electrode for both the n-channel and p-channel MOS transistors in the CMOS circuit.

Figure 1:
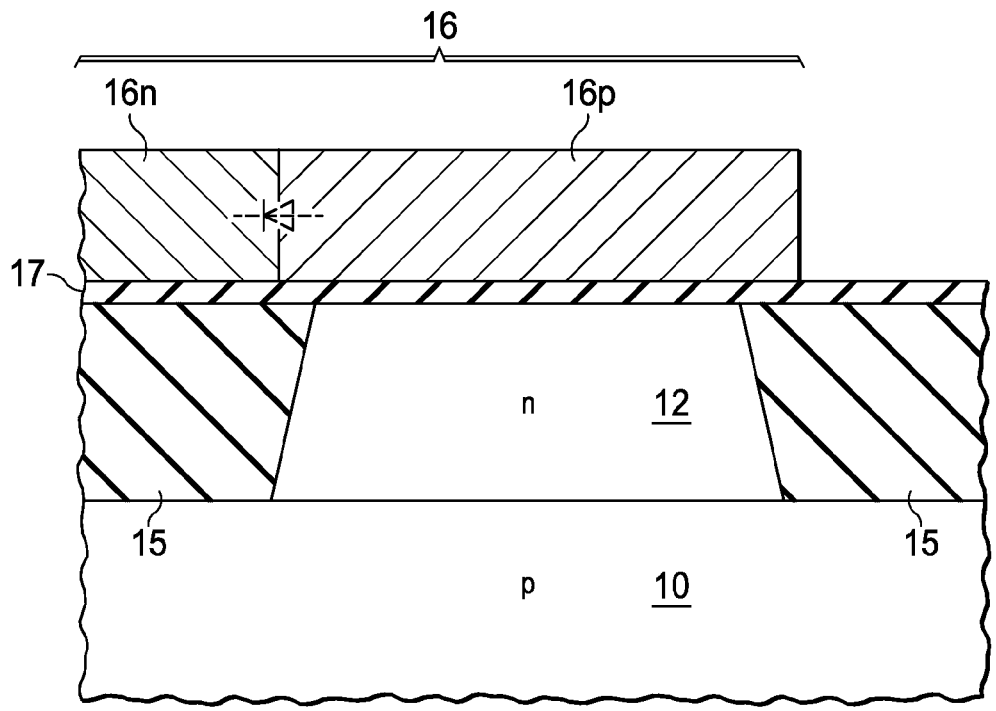
FIG. 1 is cross-sectional view of a portion of a conventional floating-gate device including both n-type and p-type portions.

However, as known in the art for silicon-gate MOS transistors, it is desirable that for n-channel MOS transistors, the silicon gate electrode itself be doped n-type, and that for p-channel MOS transistors, the silicon gate electrode itself be doped p-type. Therefore, in order for the unitary polysilicon floating-gate electrode to serve as the gate for both the p-channel and n-channel devices, that polysilicon electrode preferably includes both p-type and n-type portions, for those respective transistor gates. As known in the art, however, the provision of both p-type and n-type regions in a single silicon element necessarily results in a p-n (i.e., rectifying) junction within that element. FIG. 1 illustrates, in cross-section, an example of a portion of such a polysilicon floating-gate electrode 16, in a conventional integrated circuit environment in which it includes a p-type portion 16p and an n-type portion 16n.

In this example, electrode 16 is formed in a polysilicon layer, overlying gate dielectric film 17 at the surface of substrate 10. P-type doped portion 16p of electrode 16 overlies n-type well 12; heavily-doped p-type source/drain regions will be disposed within that well 12 (e.g., orthogonal to the view of FIG. 1), typically in self-aligned fashion relative to electrode 16 in the conventional manner. Well 12 is disposed between isolation dielectric structures 15, as typical in the art. At some location away from n-well 12 in this conventional example, electrode 16 becomes n-type doped, forming n-type doped portion 16n as shown. In the CMOS floating-gate context, electrode 16 will continue in its length, forming a gate of an n-channel MOS transistor, a plate of a storage capacitor, and a plate of at least one tunnel capacitor in the conventional manner.

In this conventional example of FIG. 1, a p-n metallurgical junction naturally forms at the interface between n-type doped portion 16n and p-type doped portion 16p of electrode 16. The diode defined at this metallurgical junction has been observed, in connection with this invention, to alter the programmability of floating-gate electrode 16, in this conventional arrangement. As will be recognized by those in the art, the quality of the diode at this metallurgical junction will tend to be inconsistent from instance to instance within an integrated circuit, and especially over a manufacturing lot, considering that this diode is defined in polycrystalline silicon rather than single-crystal silicon. The diode quality will depend on such physical features as the grain size in the polysilicon relative to the width of electrode 16, the alignment of grain boundaries within the film and especially at the metallurgical junction, and the like. As such, in some instances, this diode is relatively leaky (i.e., operates as a poor diode, conducting in its reverse-biased state), while in other instances this diode is relatively good (i.e., relatively low conduction in the reverse-biased state). In the case in which the programming mechanism relies on electrons tunneling to electrode 16 at some location within its n-type doped portion, the extent and rapidity with which those electrons are conducted to and remain at p-type doped portion 16p will depend on the quality of the diode at the metallurgical junction within electrode 16. In any event, the presence of this diode within polysilicon floating-gate electrode 16 has been observed, according to this invention, to introduce substantial variability in the programming and erase performance of polysilicon floating-gate electrodes that include a p-n junction due to having both n-type and p-type portions.

According to embodiments of this invention, a structure for an analog floating-gate electrode, and a method of forming such an electrode in the manufacture of an integrated circuit, are provided in which both n-type and p-type doped regions are provided within the electrode, but in which the variability introduced by diode junctions is eliminated.

Figure 2:
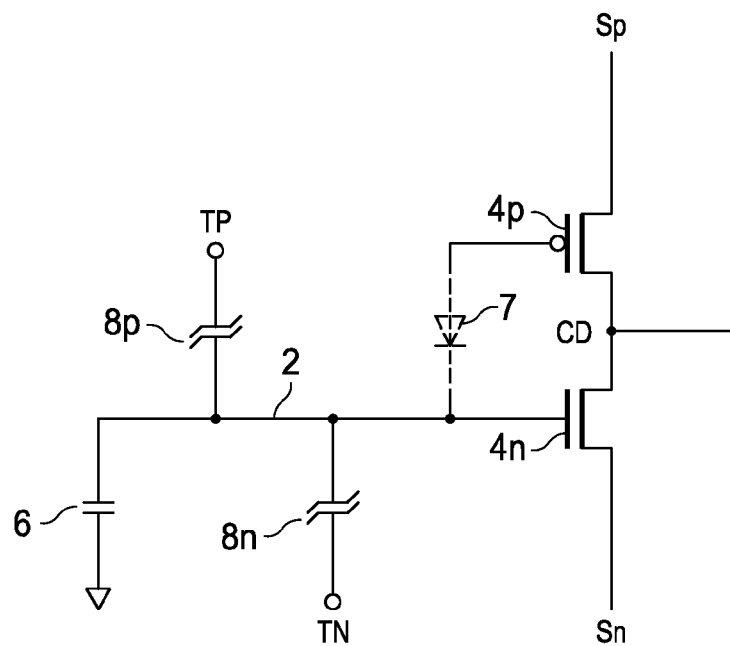
FIG. 2 is an electrical diagram, in schematic form, of a programmable floating gate device constructed according to embodiments of the invention.

FIG. 2 illustrates an electrical schematic incorporating analog floating-gate electrode 2 according to embodiments of this invention. In this example, analog floating-gate electrode 2 is a single electrode serving multiple functions. Electrode 2 serves as the gate electrode for p-channel metal-oxide-semiconductor (MOS) transistor 4p, n-channel MOS transistor 4n, and as a first plate of storage capacitor 6. A second plate of storage capacitor 6 is coupled to a reference voltage, namely ground in this example. In embodiments of this invention, the circuit of FIG. 2 constitutes an analog memory element implemented into an analog memory circuit. Alternatively, transistors 4p, 4n may serve as an input of another type of analog circuit, or another function such as an amplifier or the like. In this example, the drains of transistors 4n, 4p are connected together at common drain node CD, which is forwarded to a downstream circuit such as a sense amplifier. In operation, the voltage stored across storage capacitor 6 determines the voltage at the gate of MOS transistor 4, and thus the extent to which transistors 4p, 4n conduct, relative to one another, for a given bias between source Sp of transistor 4p and source Sn of transistor 4n.

In embodiments of this invention, analog floating-gate electrode 2 can be programmed to a particular analog state by way of tunnel capacitors 8p, 8n. Analog floating-gate electrode 2 serves also as a first plate of each of these tunnel capacitors 8p, 8n. In this example, a second plate of tunnel capacitor 8p is connected to a terminal TP, while a second plate of tunnel capacitor 8n is connected to a terminal TN. The capacitor dielectric for tunnel capacitors 8p, 8n is contemplated to be relatively thin, to allow mechanisms such as Fowler-Nordheim tunneling to transfer charge between terminals TP, TN and analog floating-gate electrode 2, depending on the bias.

In operation, the programming of analog floating-gate electrode 2 by electrons tunneling through tunnel capacitor 8n is performed by applying a pulse of an appropriate negative voltage to terminal TN, relative to the voltage at terminal TP and to the ground reference voltage at the opposite plate of storage capacitor 6. An example of such a "programming" pulse, for a fully programmed level, is a voltage of about −11 volts at terminal TN relative to terminal TP and ground, for on the order of 20 msec. The voltage divider of capacitors 8n, 8p, 6 will result in most of that voltage appearing across tunnel capacitor 8n, enabling electrons to tunnel through its capacitor dielectric to analog floating-gate electrode 2. Those electrons will remain trapped at analog floating-gate electrode 2, considering that there is no direct (i.e., DC) connection between analog floating-gate electrode 2 and any other circuit element. Conversely, electrons can be removed from analog floating-gate electrode 2 by tunneling through tunnel capacitor 8p to terminal TP, upon application of an appropriate positive voltage at terminal TP relative to terminal TN and to the ground reference voltage at the opposite plate of storage capacitor 6. The voltage divider of capacitors 8n, 8p, 6 will result in most of that voltage appearing across tunnel capacitor 8p, enabling electrons to tunnel through its capacitor dielectric from analog floating-gate electrode 2. An example of such a "erase" pulse, to remove a fully programmed level, is a voltage of about +11 volts at terminal TP relative to terminal TN and ground, for on the order of 20 msec. The duration of the program and erase pulses can be adjusted to precisely set the charge state at analog floating-gate electrode 2. The charge trapped at analog floating-gate electrode 2 will thus define the voltage across storage capacitor 6, and thus the voltage at the gates of MOS transistors 4p, 4n. Tunnel capacitors 8n, 8p thus enable precise setting of the charge at analog floating-gate electrode 2, and thus precise adjustment of the analog state of the circuit including MOS transistor 4.

For good performance, it is beneficial for the portion of analog floating-gate electrode 2 serving as the gate of p-channel transistor 4p to be formed of p-type doped polysilicon, and for the portion of electrode 2 serving as the gate of n-channel transistor 4n to be n-type doped polysilicon. In the arrangement of FIG. 2, however, the provision of a p-type gate for transistor 4p in unitary polysilicon electrode 2 in which n-type doped polysilicon serves as the gate for transistor 4n and as a plate of each of capacitors 6, 8p, 8n, results in parasitic diode 7 disposed between the gate portion of electrode 2 at transistor 4p and the remainder of electrode 2. As discussed above in connection with FIG. 1, however, it has been discovered that conventional formation of the structure of electrode 2, including metallurgical p-n junctions and thus parasitic diode 7 (FIG. 2) within the polysilicon electrode, can cause inconsistent and degraded performance. In the arrangement of FIG. 2, if parasitic diode 7 remains in place, the ability of p-channel transistor 4p to accurately respond to the charged state of polysilicon electrode 2 is hampered. If the physical placement of transistor 4p between tunnel capacitors 8p, 8n and storage capacitor 6 resulted in two instances of parasitic diode 7 (i.e., two diodes of opposite polarity between the plates of tunnel capacitors 8p, 8n, on one hand, and the plate of storage capacitor 6, on the other hand, these diodes would not only affect the read of programmed state, but would also affect the programming performance of the circuit. According to embodiments of this invention, polysilicon electrode 2 is constructed to eliminate the effect of such parasitic diodes 7 that necessarily form within its structure by virtue of including both n-type and p-type doped portions.

Figure 4A:
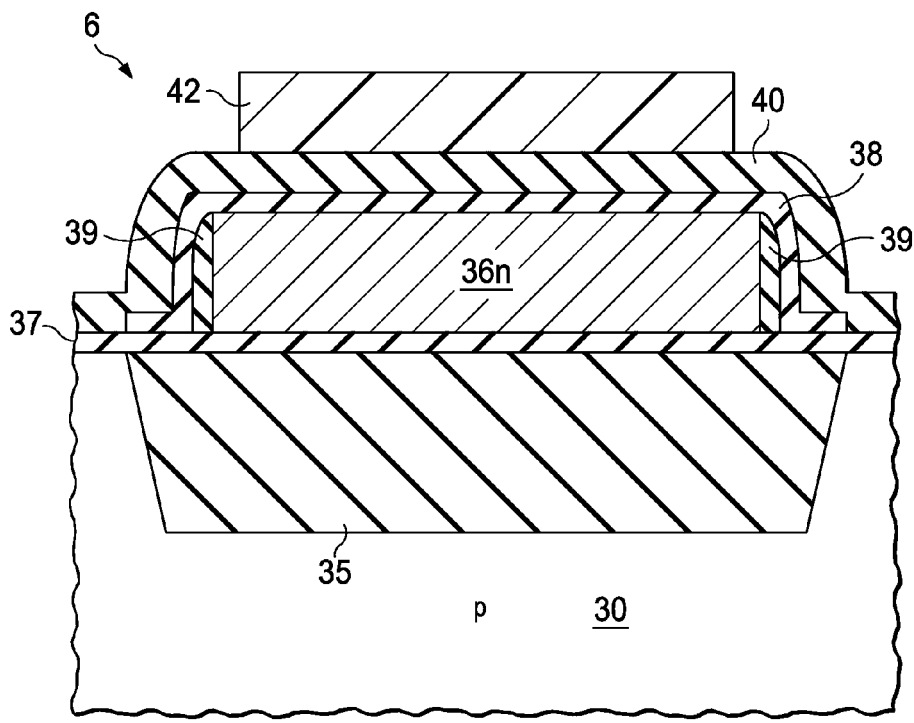
FIGS. 4a through 4e and 4g are cross-sectional views.
Figure 4B:
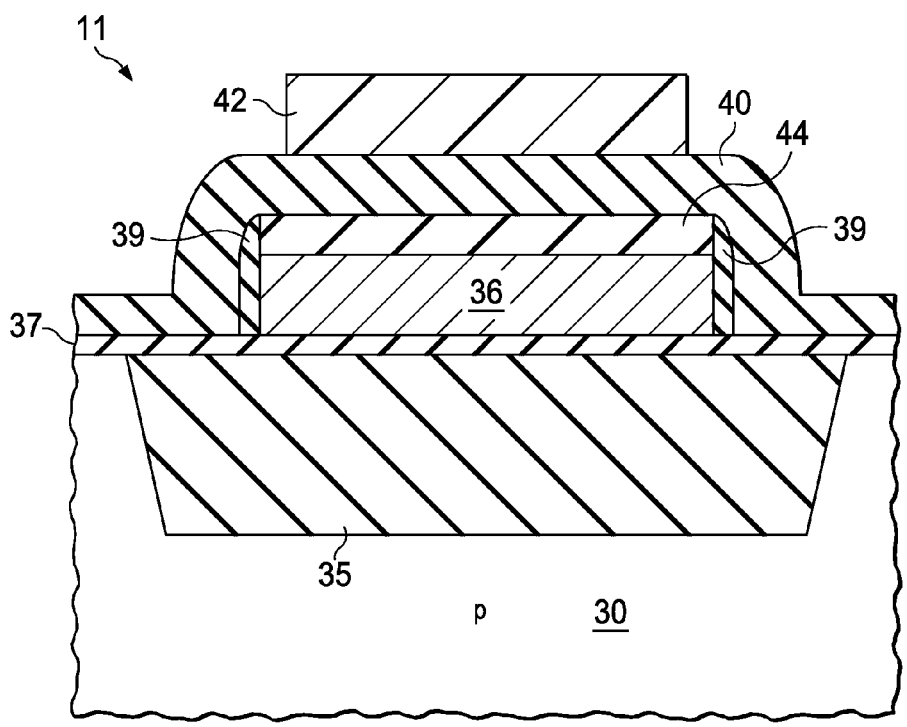
Figure 4C:
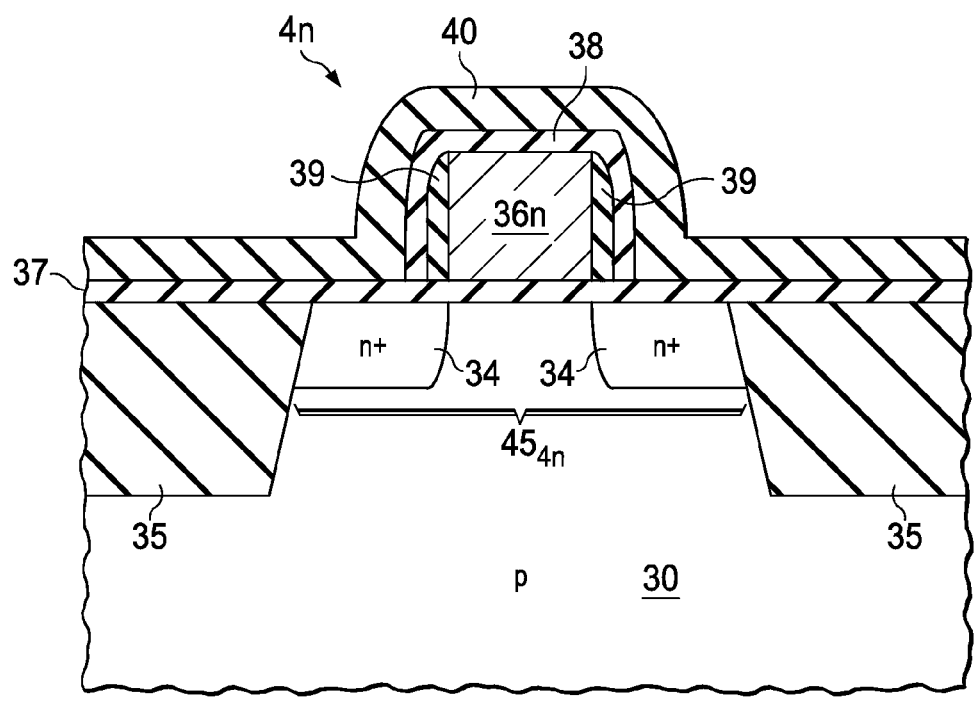
Figure 4D:
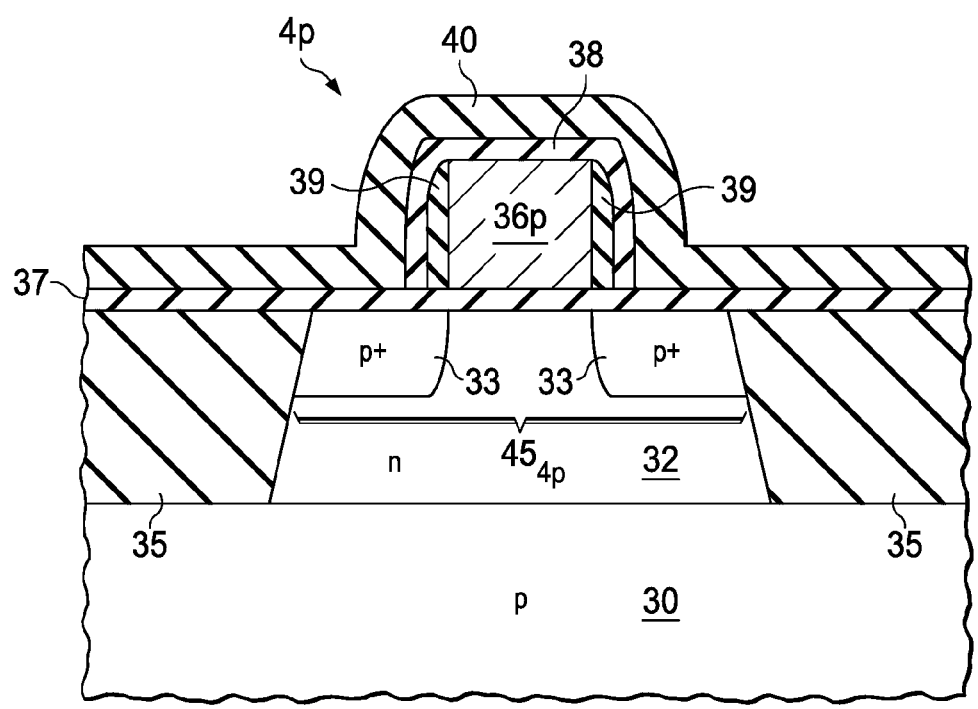

FIG. 3 illustrates, in plan view, the construction of a circuit such as that shown in connection with FIG. 2, according to an embodiment of this invention. Corresponding FIGS. 4a through 4e illustrate, in cross-section, the construction of the various structures shown in FIG. 3; FIG. 4f illustrates a portion of this circuit in a closer plan view. It is contemplated that the sizes of elements shown in FIGS. 3 and 4a through 4e are not necessarily to scale, relative to one another. For example, the element widths shown in FIG. 3 may be substantially thinner, in actuality, relative to the length of the same element, depending on the manufacturing technology utilized. Similarly, the relative thicknesses of elements in the cross-sectional views of FIGS. 4a through 4e may not correspond to that encountered in actual devices. In any case, it is contemplated that this embodiment of the invention may be implemented using relatively aggressive manufacturing technology, extending into the sub-micron regime. It is therefore contemplated that those skilled in the art having reference to this specification will be readily able to adapt the structures of FIG. 3 and FIGS. 4a through 4f in the desired manufacturing technology, without undue experimentation.

As shown in FIG. 3, analog floating-gate electrode 2 is constructed of polycrystalline silicon (polysilicon) element 36, which extends over the surface of a semiconductor wafer (or, in the silicon-on-insulator context, a support wafer having a semiconductor layer at a surface), to reach multiple devices or components. As will be described in further detail below, polysilicon element 36 includes an n-type doped portion 36n, and a p-type doped portion 36p, at different locations along its length. Polysilicon element 36 has a widened portion at one end, within its n-type doped portion 36n in this example, serving as a lower plate of storage capacitor 6. This lower plate widened portion of polysilicon element 36 may alternatively be p-type doped, if desired. Referring to FIG. 4a, in this example the lower plate portion of polysilicon element 36n overlies isolation dielectric structure 35, which is typically formed of silicon dioxide, deposited into a shallow trench previously etched into the semiconductor surface. Gate dielectric 37, for example formed of deposited silicon dioxide, is disposed between the surface of isolation dielectric structure 35 and polysilicon element 36n. In this example, the surface into which isolation dielectric structure 35 is formed is the top surface of p-type silicon substrate 30. The upper plate of storage capacitor 6 is formed of tantalum nitride (TaN) plate 42, which overlies the widened portion of polysilicon element 36n at this location. In this embodiment of the invention, the capacitor dielectric is formed of silicon dioxide layer 38 disposed at the top surface of polysilicon element 36n, with silicon nitride layer 40 disposed over silicon dioxide layer 38. Sidewall nitride (i.e., silicon nitride) elements 39 are disposed along the sidewalls of polysilicon element 36n, underlying silicon dioxide layer 38.

According to embodiments of this invention, silicon dioxide layer 38 serves as a "silicide-block" dielectric. As known in the art, many integrated circuits are constructed to include a metal silicide cladding at certain silicon structures, such as transistor gate electrodes and polysilicon interconnects, to improve the conductivity of those structures. Conventionally, this metal silicide cladding is performed by direct reaction of a metal (e.g., cobalt, titanium, tungsten) deposited over the silicon structures to be silicide-clad, followed by a high temperature anneal to react the deposited metal with the underlying silicon. An etch is then performed to remove the unreacted metal from those locations at which the metal was not in contact with underlying silicon (e.g., over isolation dielectric structures 35 or gate dielectric 37). As known in the art, a "silicide-block" dielectric film (e.g., silicon dioxide layer 38) can be previously deposited overall, and subjected to a patterned etch so that specific silicon locations, such as the portion of polysilicon element 36 forming analog floating-gate electrode 2 (FIG. 3) will not become silicide-clad.

According to embodiments of this invention, as will be described in detail below in connection with FIGS. 4f and 4g, this silicide-block silicon dioxide layer 38 will have one or more openings formed in it along the top surface of polysilicon element 36, each at the location of a p-n metallurgical junction within polysilicon element 36.

As mentioned above, other structures formed within the same polysilicon level as analog floating-gate electrode 2 in this integrated circuit will be silicide-clad. For example, referring to FIGS. 3 and 4b in combination, capacitor 11 is shown as an element in the same integrated circuit as analog floating-gate electrode 2, but is not electrically connected to analog floating-gate electrode 2. Capacitor 11 may serve, for example, as a capacitor within the same electrical circuit incorporating analog floating-gate electrode 2 or in another circuit. A lower plate of capacitor 11 is formed of another instance of polysilicon element 36 (doped either n-type or p-type), overlying isolation dielectric structure 35 and gate dielectric 37 (FIG. 4b). In this instance of capacitor 11, however, silicon-block silicon dioxide 38 is not present over (i.e., has been removed from) polysilicon element 36. As such, metal silicide 44 has been formed over polysilicon element 36, consuming some of polysilicon element 36 in forming this cladding. Sidewall nitride elements 39 preclude the formation of metal silicide 44 on the sidewalls of polysilicon element 36. Silicon nitride layer 40 is disposed over metal silicide 44, over which metal nitride plate 42 is deposited and patterned as shown.

It has been discovered, in connection with this invention, that the formation of metal silicide 44 over polysilicon element 36 is not conducive to long-term retention of charge, for example by analog floating-gate electrode 2. In this regard, it has been discovered that some residue of unreacted metal (or, in some cases, metal nitride or other reactive products between the deposited metal and the gas constituents of the environment in which the direct reaction takes place) often remains at locations adjacent to metal silicide 44 structures at transistor gates, capacitor plates, etc. This residue can be at least partially conductive in many instances, even if vanishingly thin or present merely as filaments. For elements involved in switching operation of the integrated circuit, such as transistor gates and interconnects, the conductivity of this residue is generally sufficiently poor that any deleterious effects are not measurable or noticeable, especially relative to the significant increase in conductivity of the silicide-clad gate level structures. However, for analog floating-gate functions such as described above, the setting of trim or reference levels at manufacture is intended to remain stable over long periods of time, hopefully for the useful life of the integrated circuit. As such, in connection with this invention, it has been discovered that charge trapped at a silicide-clad polysilicon capacitor plate and gate structure, serving as an analog floating-gate structure, is vulnerable to long-term leakage. The loss of this charge will, of course, alter the operation of circuits relying on the programmed adjustment or setting of charge at such a structure.

According to this embodiment of the invention, therefore, analog floating-gate electrode 2 of FIG. 3 is constructed to include silicide-block silicon dioxide layer 38, as shown in FIG. 4a. Use of this silicide-block silicon dioxide layer 38 allows the implementation of silicide cladding on other silicon structures in the same integrated circuit (such as the lower plate of capacitor 11 of FIGS. 3 and 4b), while still enabling long-term charge retention at analog floating-gate structures 2 in the same integrated circuit. In addition, as will be described in further detail below, silicide cladding will be formed at a particular location of analog floating-gate electrode 2 itself (at which an opening in silicide-block silicon dioxide layer 38 is etched), according to embodiments of this invention. Other complicating process steps, such as deposition and patterning of additional levels of polysilicon, are also avoided in the formation of analog floating-gate electrode 2 according to embodiments of this invention.

According to this embodiment of the invention, analog floating-gate electrode 2 also serves functions in other devices, including transistors 4p, 4n, and tunnel capacitors 8p, 8n. As shown in FIG. 3, the instance of polysilicon element 36 defining analog floating-gate electrode 2 has an elongated portion extending from storage capacitor, and overlying active region $45_{4n}$. Active regions $45_{4n}$, $45_{4p}$, $45_{8p}$, and $45_{8n}$ shown in FIG. 3 are defined in the conventional manner as regions of the semiconductor surface at which isolation dielectric structures 35 are not located. At its location over active region $45_{4n}$, as shown in FIG. 4c, polysilicon electrode 36n defines a gate electrode of n-channel transistor 4n, with gate dielectric 37 disposed between polysilicon electrode 36n and the surface of active region $45_{4n}$, as shown. Silicon nitride layer 40 is disposed overall, as shown in FIG. 4c.

In this example, active region $45_{4n}$ is disposed between isolation dielectric structures 35, and is formed at a surface of p-type substrate 30; alternatively, this active region $45_{4n}$ may be formed at the surface of a p-type well that is formed into the substrate, as known in the art. According to this embodiment of the invention, n-channel MOS transistor 4n includes heavily-doped n-type source/drain regions 34, formed on opposite sides of polysilicon element 36n, in the conventional self-aligned fashion. Sidewall nitride elements 39, on the sidewalls of polysilicon element 36, space the heavily doped source/drain implant from the edges of the gate; in the conventional manner, lightly-doped source/drain extensions may be present under sidewall nitride elements 39, having been implanted before the formation of that film. The particular source/drain junction gradients can be engineered to the desired profile, as well known in the art.

Referring back to FIG. 3, analog floating-gate electrode 2, formed in an instance of polysilicon element 36, extends further and overlies active region $45_{4p}$, at which p-channel MOS transistor 4p is formed. In this embodiment of the invention, p-type doped portion 36p of polysilicon element 36 is the portion of analog floating-gate electrode 2 that overlies active region $45_{4p}$. FIG. 4d provides a cross-sectional view of p-channel transistor 4p, as will now be described. Analog floating-gate electrode 2 throughout its length, as described above, is implemented as polysilicon element 36, protected from silicidation by silicide-block silicon dioxide layer 38 as shown also in FIG. 4d. At active region $45_{4p}$, polysilicon element 36p is separated from the surface by gate dielectric layer 37, which serves as the gate dielectric of p-channel transistor 4p. Silicon nitride layer 40 is disposed overall, as shown in FIG. 4d.

Transistor 4p in this embodiment of the invention is formed at the surface of n-well 32, disposed at the surface of substrate 30 between isolation dielectric structures 35 as shown in FIG. 4d. N-well 32 is a relatively lightly-doped n-type region, formed at selected locations of the surface of substrate 30 in the manner known in the art. Heavily-doped p-type regions 33 are formed on opposite sides of polysilicon element 36 in this active region $45_{4p}$, in the conventional self-aligned manner for source and drain regions of p-channel MOS transistors. As described above in connection with transistor 4n, silicide-block silicon dioxide layer 38 and sidewall nitride elements 39 reside on the sidewalls of polysilicon element 36p, and space these ion implants used to form p+ regions 33 in the desired manner; some lateral diffusion of this p-type dopant under the edges of polysilicon element 36p occurs, as shown in FIG. 4d. Lightly-doped source/drain extensions may also be formed to extend beneath sidewall nitride elements 39, as mentioned above and as known in the art, if a graded junction profile is desired for this p-channel MOS transistor 4p.

Figure 4E:
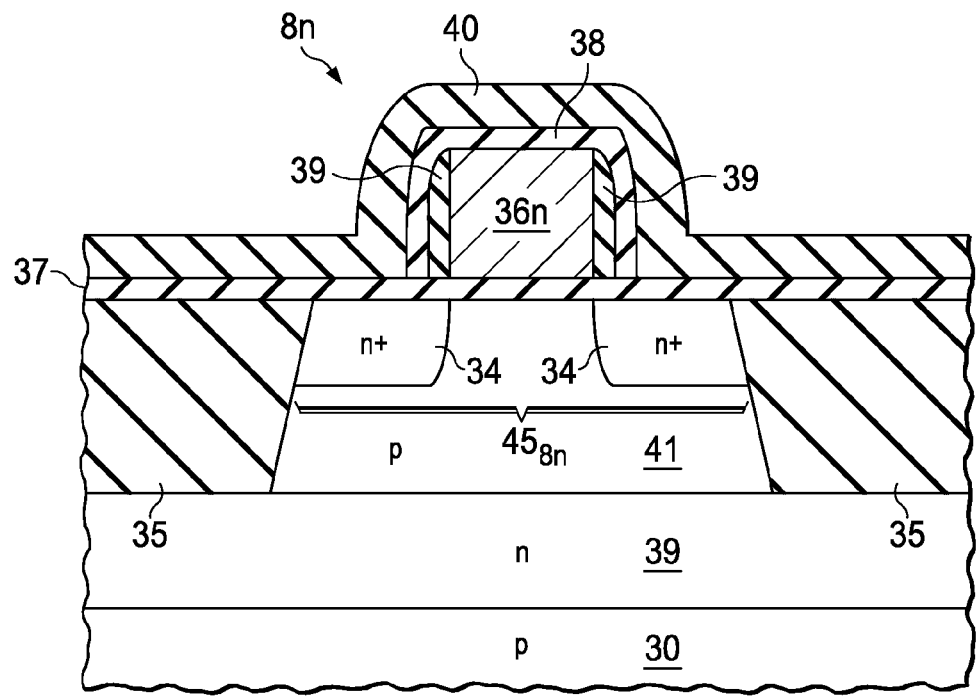
Figure 4F:
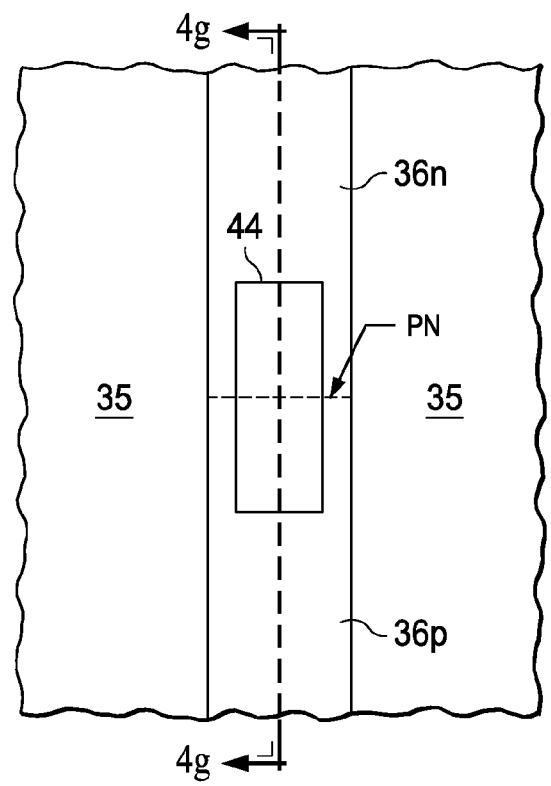
FIG. 4f is an expanded plan view, of the device of FIG. 3, according to that embodiment of the invention.

Analog floating-gate electrode 2 also extends over active region $45_{8n}$, to form tunneling capacitor 8n, as shown in FIGS. 3 and 4e. In this location of the integrated circuit, polysilicon element 36n is also protected from silicidation by silicide-block silicon dioxide layer 38, as at other locations of the structure. Gate dielectric 37 is disposed between polysilicon element 36n and the surface of active region $45_{8n}$ at this location of active region $45_{8n}$, serving as the capacitor dielectric of tunnel capacitor 8n. Active region $45_{8n}$ is defined as the location between isolation dielectric structures 35, as shown in FIG. 4e. Silicon nitride layer 40 is disposed overall, as shown in FIG. 4e.

The underlying structure of tunnel capacitor 8n differs from that of transistor 4n, in this example. N-type buried layer 39 is disposed at this location, to a relatively deep extent underlying the surface of active region $45_{8n}$. Isolated p-well 41 is present at active region $45_{8n}$, ending at a depth above that of n-type buried layer 39. P-well 41 is isolated in the sense that it is not electrically connected or physically in contact to other p-wells within the integrated circuit; in this example, p-well 41 is contained between isolation dielectric structures 35 as shown. P-well 41 is a relatively lightly-doped p-type region, as typical for well structures in the art. Heavily-doped n-type regions 34 are disposed on opposite sides of polysilicon element 36 in this active region $45_{8n}$, spaced apart from the gate edges by sidewall nitride elements 39, in the conventional self-aligned manner for source and drain regions such as that of n-channel MOS transistor 4n described above in connection with FIG. 4c. Tunnel capacitor 8n may also include lightly-doped source/drain extensions, as described above in connection with transistor 4n. N-type regions 34 are preferably formed simultaneously with source/drain regions 34 of transistor 4n.

While not shown in FIGS. 3 and 4e, top-side contacts to overlying metal conductors are provided in connection with tunneling capacitor 8n. Typically, these top-side contacts will short together n+ regions 34 and p-well 41, implementing tunnel capacitor 8n (rather than an n-channel MOS transistor). As described above in connection with FIG. 2, the voltage at p-well 41 and n+ regions 34 will be driven to a negative voltage during program operations (i.e., placement of electrons onto analog floating-gate electrode 2), while n-type buried layer 39 will be held at ground or some other stable voltage. Under that bias, the p-n junction between p-well 41 and buried layer 39 will be will be reverse-biased, as desired. Gate dielectric 37 is contemplated to be sufficiently thin that tunneling electrons can tunnel therethrough under that bias. As such, the p-n junction between p-well 41 and n-type buried layer 39 will be reverse-biased. Under this programming bias, electrons can tunnel through the relatively thin gate dielectric 37, to become trapped at analog floating-gate electrode 2.

Tunnel capacitor 8p in this embodiment of the invention is formed at the location at which polysilicon element 36p overlies active region $45_{8p}$, as shown in FIG. 3. The cross-sectional view of tunnel capacitor 8p is essentially identical to that of p-channel transistor 4p shown in FIG. 4d, except that n-type polysilicon element 36n, rather than p-type polysilicon, overlies the surface of n-well 32 formed into substrate 30 between isolation dielectric structures 35 as shown in FIG. 4d, serving as the plate of tunnel capacitor 8p. While the polysilicon plate of tunnel capacitor 8p may be formed from p-type doped polysilicon, it is believed that n-type polysilicon serves as a better emitter of electrons than does p-type polysilicon. Similarly as in transistor 4p, heavily-doped p-type regions 33 are formed on opposite sides of polysilicon element 36n within active region $45_{8p}$, in the conventional self-aligned manner for source and drain regions (of p-channel MOS transistors, in this case). This portion of polysilicon element 36n is also protected from silicidation by silicide-block silicon dioxide layer 38, as described above. In contrast to transistor 4p, however, top-side contacts are provided to short p+ regions 33 and n-well 32 together at the location of tunnel capacitor 8p.

In operation, as described above in connection with FIG. 2, the voltage at n-well 32 and p+ regions 33 will be driven to a positive voltage during erase operations (i.e., removal of electrons from analog floating-gate electrode 2); in that event, the p-n junction between n-well 32 and substrate 30 will be reverse-biased, as desired. Gate dielectric 37 is contemplated to be sufficiently thin that tunneling electrons can tunnel therethrough under that bias.

Many variations in the construction of this region of the integrated circuit relative to that described above are contemplated. For example, the various wells and buried layers within substrate 30 can be realized in other ways than that shown and described in this specification. It is contemplated that those skilled in the art having reference to this specification will be readily able to realize those bulk structures and doping profiles, in a manner consistent with the operative manufacturing process and the function of tunnel capacitors 8p, 8n, transistors 4p, 4n, and storage capacitor 6 as appropriate for the particular circuit application.

Referring back to FIG. 3, a significant difference in relative area between tunneling capacitors 8p, 8n, on one hand, and storage capacitor 6, on the other hand, will be evident to those skilled in the art having reference to this specification. This difference in relative area will, of course, be reflected in the relative capacitances between these elements. Of course, differences in the capacitor dielectric materials, and thicknesses, will also be reflected in those capacitances. In any event, it is desirable that the capacitance of storage capacitor 6 is substantially larger than the capacitances of tunnel capacitors 8n, 8p (and also the parasitic gate-to-active capacitances of transistor 4p, 4n), to facilitate tunneling of electrons at reasonable bias voltages (thus avoiding damage or breakdown). In one example of embodiments of this invention, storage capacitor 6 occupies an area of about 1525 m$^2$ with a capacitor dielectric (silicon nitride layer 40) of about 400 Å, while tunneling capacitors 8p, 8n occupy an area of about 2.5 m$^2$ with a capacitor dielectric (gate dielectric 37) of about 75 Å; transistors 4p, 4n each occupy an area of about 40 m$^2$ in this example. The resulting vast disparity in coupling among these circuit elements is contemplated to be provide excellent programming and erasure (i.e., tunneling) performance.

In addition, as described above, the use of silicide-block silicon dioxide layer 38 overlying polysilicon element 36 in forming analog floating-gate electrode 2 enables outstanding long-term retention of electrons at that structure, without risking charge leakage via silicidation residue and the like. However, according to embodiments of this invention, a portion of the surface of polysilicon element 36 defining analog floating-gate electrode 2 is intentionally exposed to silicidation, to improve the programming and erase performance of the circuit, as will now be discussed.

As shown in FIG. 3, p-type doped portion 36p and n-type portion 36n abut one another within polysilicon element 36 defining analog floating-gate electrode 2. Because the abutting portions 36p, 36n are of opposite semiconductor conductivity type, a p-n metallurgical junction is present at this interface. That p-n junction operates as a rectifying junction, or diode, and has been observed to affect the programming and erase performance of the circuit, particularly in the repeatability and consistency of that programming and erase performance among floating gates in the same integrated circuit, and among integrated circuits.

According to embodiments of this invention, this deleterious effect is overcome by the formation of a silicide film at that interface within polysilicon element 36, as shown in FIG. 3 and as will now be described in further detail in connection with FIGS. 4f and 4g.

FIG. 4f shows a more detailed plan view of the interface region between n-type doped polysilicon element 36n and p-type doped polysilicon element 36p, within analog floating-gate electrode 2 of FIG. 3; FIG. 4g is a corresponding cross-sectional view of this region. As evident from FIGS. 4f and 4g, p-n junction PN is present at the metallurgical junction between n-type doped polysilicon element 36n and p-type doped polysilicon element 36p. At this location of analog floating-gate electrode 2, both of polysilicon elements 36n, 36p are disposed over isolation dielectric structure 35, and gate dielectric 37; silicon nitride layer 40 is disposed overall.

Figure 4G:
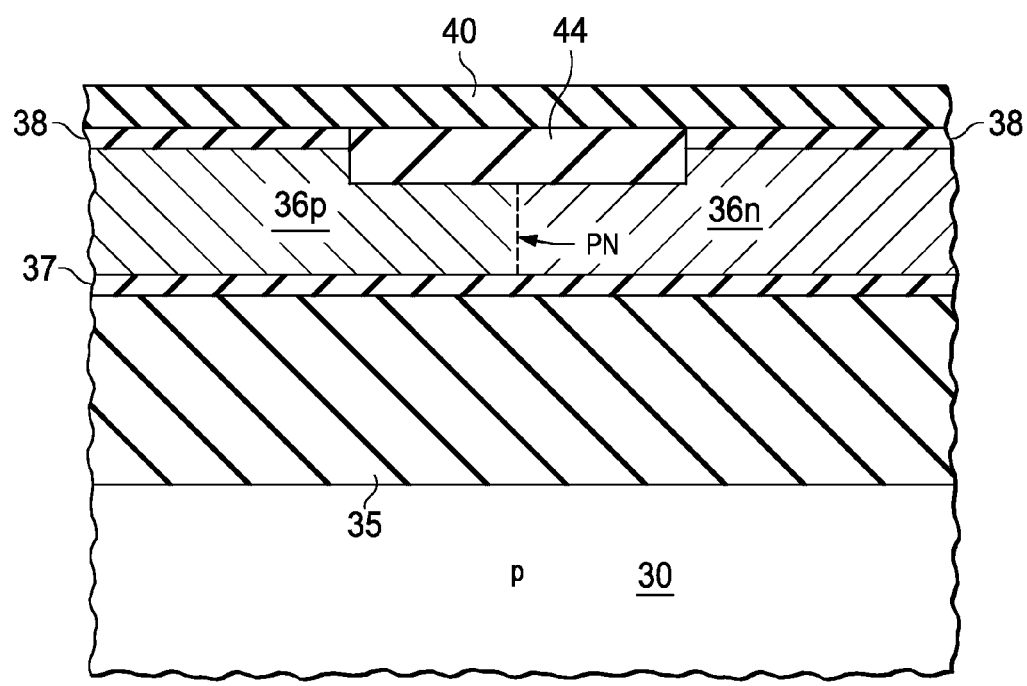

As shown in FIG. 4g, silicide-block silicon dioxide 38 covers much of n-type doped polysilicon element 36n and p-type doped polysilicon element 36p. However, according to embodiments of this invention, silicide-block silicon dioxide 38 is not present at a portion of the top surface of n-type doped polysilicon element 36n and p-type doped polysilicon element 36p, including the surface location of p-n junction PN. At this location, silicide-block silicon dioxide 38 is exposed to the etch of that material, with that exposure defined by the pattern of the masking material (e.g., photoresist) that protects the remainder of analog floating-gate electrode 2 from the silicon dioxide etch. As will be evident below from the description of the manufacturing processes for analog floating-gate electrode 2 according to embodiments of this invention, this opening through silicide-block silicon dioxide 38 allows subsequently-deposited metal to contact polysilicon at that location, and to react with the polysilicon of polysilicon element 36 to form silicide cladding 44 within that opening. Because silicide cladding 44, of a metal silicide such as cobalt silicide or titanium silicide, is highly conductive and straddles p-n junction PN, silicide cladding 44 serves to short out the parasitic diode established at p-n junction PN. To the extent that diode behavior is established at the metallurgical junction between n-type doped polysilicon element 36n and p-type doped polysilicon element 36p, those effects are eliminated by silicide cladding 44. It is contemplated that silicide cladding 44 will be present at each location of analog floating-gate electrode 2 at which a p-n junction is possible. In the example of FIG. 3, only one such location exists, considering that p-channel transistor 4p (for which p-type polysilicon electrode portion 36p is useful) is located so that only one such silicide strap is necessary in analog floating-gate electrode 2. If additional p-n junction locations are present in analog floating-gate electrode 2 due to the doping pattern of polysilicon element 36, then additional openings in silicon-block silicon dioxide layer 38 and thus additional instances of silicide cladding 44 should be provided.

As discussed above, embodiments of this invention provide the important benefits of enabling long-term storage of precise levels of trapped charge, such as useful in an analog floating-gate circuit such as a memory element. In addition, embodiments of this invention provide excellent performance of such elements in a CMOS environment, with both the p-channel and n-channel transistors having the good performance provided by properly doped silicon gates. This invention provides that outstanding performance, without unduly complicating the manufacturing process flow involved in construction of the integrated circuit, as will now be described in connection with FIG. 5.

Manufacturing of the integrated circuit including analog floating-gate electrode 2 according to embodiments of this invention begins with process 50, in which various doped regions are defined and formed into the semiconducting surface of substrate 30. These doped regions include regions such as n-type buried layer 39, n-type well 32, p-type well 41, as shown in FIGS. 4d and 4e, and the like, depending on the desired eventual structures. In process 52, isolation dielectric structures 35 are formed at selected locations of the surface. These isolation dielectric structures 35 may be formed in various conventional ways, including shallow trench isolation, deep trench isolation, local oxidation of silicon (LOCOS), and the like. As known in the art, the formation of isolation dielectric structures 35 serve to define the location of active regions of the semiconducting surface, at which transistors and some capacitors (including tunnel capacitors $8p$, $8n$ in embodiments of the invention described above) are formed. While process 50 is shown as preceding process 52 in this example, in some manufacturing flows, the order of these steps may be reversed; further in the alternative, some wells and buried layers may be formed prior to isolation dielectric structures 35, with others formed after the formation of those isolation dielectric structures.

Following the definition of active regions at the surfaces of the desired well or wells (processes 50, 52), gate dielectric layer 37 is then formed in process 54. Gate dielectric 37 may be a deposited insulator, such as silicon dioxide, especially in modern sub-micron manufacturing processes with constrained thermal budgets. Alternatively, gate dielectric layer 37 may be formed by thermal oxidation of silicon, in the conventional manner. Following the formation of gate dielectric layer 37 in process 54 (and any desired threshold adjust ion implantation etc.), a polycrystalline silicon layer from which polysilicon elements 36 are to be formed is then deposited overall, in process 56.

In process 57, the desired portions of the polysilicon layer deposited in process 56 are doped n-type, by way of a patterned ion implant of the appropriate species. Typically, this patterned n-type implant is used to dope such structures as polysilicon resistors formed in this level. In this embodiment of the invention, the portions of the polysilicon layer including n-type polysilicon portion $36n$ of FIG. 3 receives this implant; the portion of this polysilicon layer including p-type polysilicon portion $36n$ is protected from this implant. The dose and energy of the n-type implant in this process 57 is contemplated to be sufficient to effectively counterdope p-type dopant included within in situ deposition of the polysilicon layer, and subsequent p-type dopant that polysilicon portion $36n$ may receive at active region $45_{8p}$ (i.e., tunnel capacitor $8p$). In process 58, polysilicon elements 36 are photolithographically patterned and etched, defining the various structures in the eventual integrated circuit that are to be formed in this polysilicon layer, including analog floating-gate electrode 2, and other structures such as the silicide-clad lower plate of capacitor 11 (FIGS. 3 and 4b), transistor gates, and the like. While doping process 57 is shown in this process flow as occurring prior to etch process 58, either or both of n-type and p-type polysilicon elements $36n$, $36p$, respectively, may instead be doped after the patterned etch of process 58. As will be described below, doping of polysilicon elements $36n$, $36p$ may also be performed later in the process, for example by way of the same implants used to form transistor source and drain regions (process 60 below).

In this example, in which graded source/drain junctions are implemented as typical in modern CMOS manufacturing, a drain extension implant (also referred to as "lightly-doped-drain", or LDD, implant) is performed in a self-aligned manner relative to the remaining polysilicon features overlying active areas, in process 59. If desired, the LDD implant may be performed for both n-channel and p-channel transistors, by way of masked implants. Following the drain extension implant, a silicon nitride layer is then deposited overall and etched anisotropically, also in this process 59, to form sidewall nitride elements 39 (FIGS. 4a through 4e) on the sidewalls of polysilicon structures including polysilicon elements $36n$, $36p$. Once sidewall nitride elements 39 are formed in this manner, masked source/drain implants of both n-type and p-type are then performed, in process 60, self-aligned to the gate level structures within the respective active regions 45, in the usual manner. As mentioned above, this source/drain implant of p-type dopant in process 60 is preferably not sufficient to counterdope the portion of polysilicon element $36n$ overlying active region $8p$, so that this plate of tunnel capacitor $8p$ will be formed from n-type polysilicon. Process 60 may also include the appropriate anneal or other high-temperature drive-in process to place the implanted dopant at the desired depth.

According to embodiments of this invention, as described above, analog floating-gate electrode 2 is protected from direct react silicidation, while other structures (the lower plate of capacitor 11, transistor gates, polysilicon interconnects, etc.) are to be silicide-clad. As such, following the patterned etch of polysilicon elements 36 in process 58, silicide-block silicon dioxide 38 is deposited overall in process 61. Materials other than silicon dioxide may alternatively be used for this silicide block material; however, because this layer eventually becomes part of the capacitor dielectric for storage capacitor 6 in embodiments of this invention, this silicide block layer should of course be electrically insulating. In addition, according to embodiments of this invention, analog floating-gate electrode 2 is intended to retain trapped charge for long periods of time; as such, it is useful for the silicide-block layer deposited in process 61 to be a high quality dielectric, from a leakage standpoint. Silicon dioxide is contemplated to be a suitable film for this purpose, as described above.

In process 62, silicide-block silicon dioxide layer 38 deposited in process 60 (or such other silicide block material, as discussed above) is photolithographically patterned and etched. According to embodiments of this invention, as described above, silicide-block silicon dioxide layer 38 is removed from those locations and instances of polysilicon element 36 that are to be silicide-clad, while retained at analog floating-gate electrode 2 and other elements that are not to be silicide-clad. It is contemplated that, in most implementations, most if not all polysilicon gate-level structures other than structures serving the function of analog floating-gate electrodes 2 will be silicide-clad, and as such will have silicide-block silicon dioxide layer 38 removed therefrom in process 62.

According to embodiments of this invention, etch process 62 also removes silicide-block silicon dioxide layer 38 from a location at the surface of the instance of polysilicon element 36 serving as analog floating-gate electrode 2, specifically at the location of that element 36 at which a p-n metallurgical junction (e.g., junction PN of FIGS. 4f and 4b) either is present or will be present following polysilicon doping. This opening etched through silicide-block silicon dioxide layer 38 will of course be defined by the photolithographic pattern used in the patterned etch of layer 38, and as such can be readily registered with the location of p-n junction PN.

Following etch process 62, the silicidation metal is then deposited overall in process 63. In the embodiments of this invention described above, the metal deposited in process 63 is cobalt; other silicidation metals such as titanium, tungsten, and the like may alternatively be used. In process 64, a high temperature anneal is performed to react this deposited metal at those locations at which the metal is in contact with underlying silicon, including at the location of junction PN in the instance of polysilicon element 36 serving as analog floating-gate electrode 2, to form cladding 44 of a metal silicide compound, as shown in FIG. 4b. Conversely, those silicon structures that are not in contact with the silicidation metal, such as the extent of analog floating-gate electrode 2 at which silicide-block silicon dioxide layer 38 remains after process 62, will not react with the deposited metal. Following the silicidation anneal of process 64, a conventional etch or strip is performed to remove the unreacted metal and byproducts from the surface, leaving silicide cladding 44 behind wherever formed.

Storage capacitor 6 and capacitor 11, among other elements, are completed with the deposition of silicon nitride layer 40 in process 70. As described above, silicon nitride layer 40 serves as the capacitor dielectric for capacitor 11, and as part of the capacitor electric for storage capacitor 6, and is contemplated to be a relatively high quality dielectric, providing high capacitance per unit area; silicon nitride is thus a good choice for this material. Alternatively, other dielectric materials such as silicon dioxide can be used as this insulating film. In process 72, the upper plate metal or metal compound for storage capacitor 6 and capacitor 11 is deposited overall in process 72. According to one example of embodiments of this invention, the material deposited in process 72 is tantalum nitride (TaN). Alternatively, another conductive material comprised of a metal, including elemental metal and also metal compounds such as metal nitrides, may be deposited in process 72 and serve as the upper plate of these devices. In process 74, this metal or metal compound layer is photolithographically patterned and etched to define the upper plates of storage capacitor 6 and capacitor 11, as well as other elements including metal interconnects, capacitor plates, bond pads, and the like.

Following process 74, the integrated circuit including analog floating-gate electrode 2 constructed according to embodiments of this invention is then completed by way of the appropriate processing steps for its other structures and elements, including the formation of insulating layers, etching of contacts, formation of metal or other conductor layers making contact to the elements described above, including the top-side contacts to the doped active regions of tunnel capacitors 8p, 8n, and the like, in the conventional manner. It is contemplated that those skilled in the art having reference to this specification will be readily able to implement those additional process steps as appropriate for the particular manufacturing process technology and the desired construction of the integrated circuit.

Embodiments of this invention provide important advantages in the fabrication of integrated circuits, including analog integrated circuits and circuits including adjustable or trimmable elements, such as reference circuits. More particularly, embodiments of this invention provide an analog floating-gate electrode structure that can be programmed and erased to precisely set an adjustable level of trapped charge that can define a particular analog level for an electronic circuit. This structure is capable of retaining that trapped charge for long periods of time, and as such is suitable for use as an element that is trimmable or adjustable at manufacture. In addition, this structure can be constructed in a manner that is compatible with existing manufacturing process flows, without unduly complicating the process flows required. Furthermore, according to this invention, analog floating-gate electrodes suitable for use as gates of both n-channel and p-channel MOS transistors, including doped silicon gates of the corresponding conductivity types for those transistors, can be readily fabricated without the undesired rectifying effects of parasitic diodes at the p-n junctions within that polysilicon electrode.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an electrically programmable capacitor structure for an analog semiconductor integrated circuit, formed at a semiconductor surface of a body, comprising the steps of:

forming isolation dielectric structures at selected locations of the semiconductor surface, the isolation dielectric structures defining active regions of the surface there between;

forming a gate dielectric layer over the active regions;

then forming an electrode layer comprised of polycrystalline silicon overall;

removing selected portions of the electrode layer to define first and second electrodes comprised of polycrystalline silicon, the first electrode including a portion overlying an isolation dielectric structure and a plurality of portions overlying active regions;

doping the polycrystalline silicon so that the first electrode has an n-type portion abutting a p-type portion at a first location;

forming source and drain regions on opposite sides of a portion of the first electrode overlying a first active region;

forming a layer of silicon dioxide over the first and second electrodes;

removing the silicon dioxide selectively from the second electrode and from an opening at the first location of the first electrode, so that the silicon dioxide remains over the first electrode at locations other than the first location;

after the step of removing the silicon dioxide, reacting exposed portions of the polycrystalline silicon, including the second electrode and at the first location of the first electrode, with a metal to form a metal silicide;

then depositing a dielectric film overall;

then depositing a conductor layer comprising a metal; and removing selected portions of the conductor layer to define a first conductive plate overlying a portion of the first electrode, at a location overlying an isolation dielectric structure, with the dielectric film and the silicon dioxide therebetween.

2. The method of claim 1, wherein the conductor layer comprises a metal nitride.

3. The method of claim 2, wherein the metal nitride is tantalum nitride.

4. The method of claim 1, wherein the step of depositing the dielectric film comprises:

depositing silicon nitride by plasma assisted chemical vapor deposition.

5. The method of claim 1, wherein the reacting step reacts polycrystalline silicon of the second electrode with cobalt to form cobalt silicide.

6. The method of claim 1, wherein the step of removing selected portions of the conductor layer also defines a second conductive plate overlying a portion of the second electrode, at a location overlying an isolation dielectric structure, with the dielectric film therebetween.

7. The method of claim 1, wherein the n-type portion of the first electrode overlies a second active region;
  wherein the n-type portion of the first electrode overlies a third active region;
  wherein the step of forming source and drain regions forms n-type source and drain regions on opposite sides of the n-type portion of the first electrode overlying the second active region; and
  wherein the step of forming source and drain regions forms p-type source and drain regions on opposite sides of the p-type portion of the first electrode overlying the third active region.

* * * * *